(12) United States Patent
Sun

(10) Patent No.: US 11,930,633 B2
(45) Date of Patent: Mar. 12, 2024

(54) SEMICONDUCTOR DEVICE AND METHOD FOR PREPARING SEMICONDUCTOR DEVICE

(71) Applicant: CHANGXIN MEMORY TECHNOLOGIES, INC., Hefei (CN)

(72) Inventor: Yule Sun, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 441 days.

(21) Appl. No.: 17/401,412

(22) Filed: Aug. 13, 2021

(65) Prior Publication Data

US 2022/0102350 A1 Mar. 31, 2022

Related U.S. Application Data

(63) Continuation of application No. PCT/CN2021/100206, filed on Jun. 15, 2021.

(30) Foreign Application Priority Data

Sep. 29, 2020 (CN) .......................... 202011049179.1

(51) Int. Cl.
 *H10B 12/00* (2023.01)
(52) U.S. Cl.
 CPC ......... *H10B 12/482* (2023.02); *H10B 12/312* (2023.02); *H10B 12/488* (2023.02)
(58) Field of Classification Search
 CPC .... H10B 12/34; H10B 12/312; H10B 12/482; H10B 12/488; H10B 12/09; H10B 12/50
 See application file for complete search history.

(56) References Cited

U.S. PATENT DOCUMENTS

| 7,576,389 | B2 * | 8/2009 | Tanaka ............ H01L 21/823437 |
| | | | 257/E21.409 |
| 9,589,898 | B2 | 3/2017 | Chun |
| 10,886,277 | B2 | 1/2021 | Hong et al. |
| 2016/0351501 | A1 | 12/2016 | Chun |
| 2019/0139963 | A1 | 5/2019 | Hong et al. |

(Continued)

FOREIGN PATENT DOCUMENTS

| CN | 1168134 C | 9/2004 |
| CN | 1941301 A | 4/2007 |
| CN | 107895721 A | 4/2018 |

(Continued)

*Primary Examiner* — Mohammad M Hoque
*Assistant Examiner* — Kevin Quinto
(74) *Attorney, Agent, or Firm* — Cooper Legal Group, LLC

(57) ABSTRACT

A method for preparing a semiconductor device, including providing a substrate, where a word line structure is formed in the substrate; a bit line supporting layer includes a first oxide layer and a first nitride layer. A bit line structure is formed in the first nitride layer, and the first oxide layer is formed on both sides of the bit line structure and located in the first nitride layer; patterning the supporting structure to form a first via corresponding to the bit line structure; and etching the bit line supporting layer to a preset height along the first via, adjusting an etching parameter and a selective etching ratio of etching gas for an oxide layer to a nitride layer, and continuing to etch the bit line supporting layer until the bit line structure is exposed, to form a polymer layer above the bit line structure.

15 Claims, 13 Drawing Sheets

(56) References Cited

U.S. PATENT DOCUMENTS

2021/0091086 A1    3/2021    Hong et al.

FOREIGN PATENT DOCUMENTS

| CN | 109003938 A | 12/2018 |
| CN | 109768014 A | 5/2019 |
| CN | 111584489 A | 8/2020 |
| TW | 508744 B | 11/2002 |

* cited by examiner

SEMICONDUCTOR DEVICE AND METHOD FOR PREPARING SEMICONDUCTOR DEVICE

CROSS-REFERENCE TO RELATED APPLICATIONS

This is a continuation of International Application No. PCT/CN2021/100206, filed on Jun. 15, 2021 and entitled "Semiconductor Device and Method for Preparing Semiconductor Device", which claims priority to Chinese patent application No. 202011049179.1, filed on Sep. 29, 2020 and entitled "Semiconductor Device and Method for Preparing Semiconductor Device". The disclosures of International Application No. PCT/CN2021/100206 and Chinese patent application No. 202011049179.1 are hereby incorporated by reference in their entireties.

TECHNICAL FIELD

The disclosure relates to the technical field of semiconductors, and particularly to a semiconductor device and a method for preparing the semiconductor device.

BACKGROUND

A Dynamic Random Access Memory (DRAM) structural cell includes a logic circuit region and a cell region for storing charges. In one aspect, as a geometric size continues to be decreased according to Moore's law, a contact resistance of a connecting circuit also continues to increase. In order to ensure low connecting resistance, it is also necessary to improve the high electrical connection between a transistor region and a capacitor region. In another aspect, as circuit contact points continue to be decreased and the etching process is affected by by-products, it is difficult to control contours of contacts of the connecting circuit.

SUMMARY

Embodiments of the disclosure provide a method for preparing a semiconductor device, the method includes: providing a substrate, wherein a word line structure is formed in the substrate and a supporting structure is formed on the substrate, the supporting structure comprising a bit line supporting layer and a word line supporting layer above the word line structure; wherein a bit line structure is formed in the bit line supporting layer, the bit line supporting layer comprises a first oxide layer and a first nitride layer, the bit line structure is formed in the first nitride layer, and the first oxide layer is formed on both sides of the bit line structure and located in the first nitride layer, patterning the supporting structure to form a first via corresponding to the bit line structure in the bit line supporting layer; and etching the bit line supporting layer to a preset height along the first via, adjusting an etching parameter and a selective etching ratio of etching gas for an oxide layer to a nitride layer, and continuing to etch the bit line supporting layer until the bit line structure is exposed, to form a polymer layer above the bit line structure, wherein the polymer layer is formed on part of a sidewall of the first via and located on both sides of the bit line structure.

Embodiments of the disclosure further provide a semiconductor device, including a substrate, a word line structure, a bit line structure, a supporting structure, and a polymer layer. The word line structure is formed in the substrate. The bit line structure is formed on the substrate and traverses the word line structure. The supporting structure is formed on the substrate and includes a bit line supporting layer and a word line supporting layer. The bit line supporting layer includes a first oxide layer and a first nitride layer. The bit line structure is formed in the first nitride layer. The first oxide layer is formed on both sides of the bit line structure and in the first nitride layer. The word line supporting layer includes a second nitride layer, a second oxide layer and a third nitride layer that are stacked. The second oxide layer is formed between the second nitride layer and the third nitride layer. A first via is formed in the bit line supporting layer to expose the bit line structure. A second via is formed in the word line supporting layer to expose the word line structure. The polymer layer is formed in the first via and formed on part of a sidewall of the first via above the first oxide layer.

REFERENCE NUMBERS IN THE DRAWINGS

100: semiconductor device;
1: substrate;
2: bit line structure; 21: bit line conductive layer; 22: bit line polycrystalline silicon layer,
3: bit line supporting layer, 31: first nitride layer; 32: first oxide layer;
4: word line structure;
5: word line supporting layer; 51: second nitride layer; 52: second oxide layer; 53: third nitride layer;
6: polymer layer;
71: first via; 72: second via; 73: bit line contact point; 74: word line contact point;
81: first mask layer; 82: photoresist layer, 83: second mask layer.

DETAILED DESCRIPTION

A method for preparing a semiconductor device provided by embodiments of the disclosure is further described in detail below in combination with the accompanying drawings and specific implementations.

The following describes a method for preparing a semiconductor device according to embodiments of the disclosure with reference to the accompanying drawings.

Figure 1:
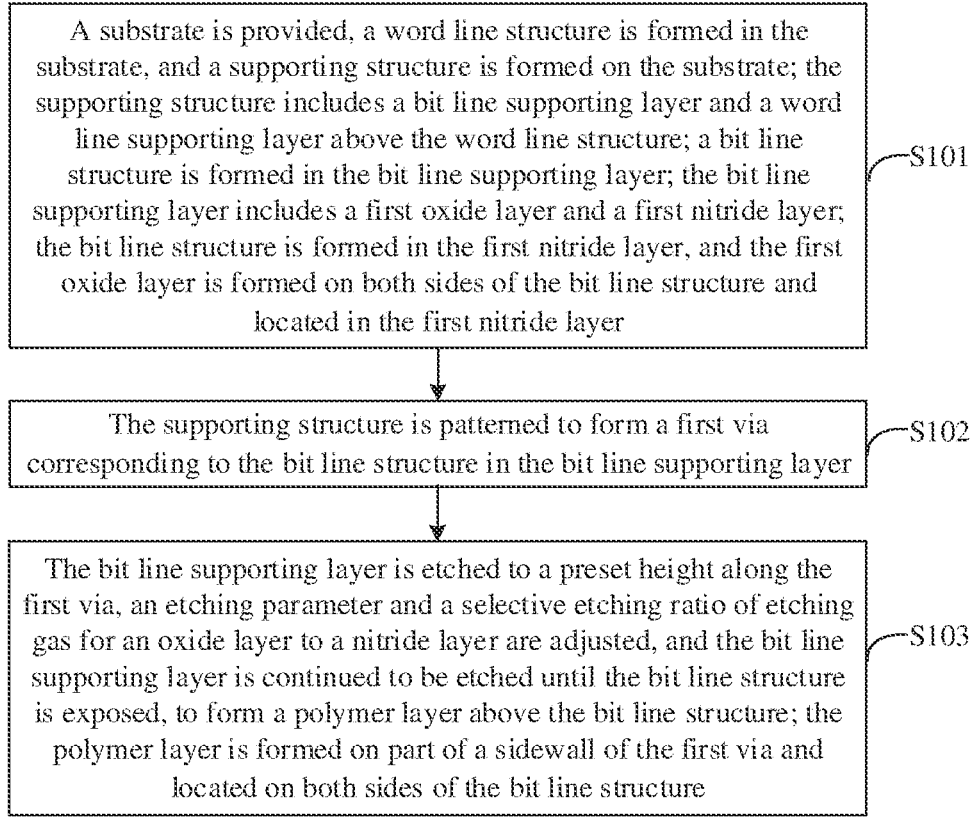
FIG. 1 shows a flowchart of implementation of a method for preparing a semiconductor device according to embodiments of the disclosure.

As shown in FIG. 1, a method for preparing a semiconductor device according to embodiments of the disclosure includes the following steps S101 to S103.

At step S101: a substrate is provided. A word line structure is formed in the substrate, and a supporting structure is formed on the substrate. The supporting structure includes a bit line supporting layer and a word line supporting layer above the word line structure. A bit line structure is formed in the bit line supporting layer. The bit line supporting layer includes a first oxide layer and a first nitride layer. The bit line structure is formed in the first nitride layer, and the first oxide layer is formed on both sides of the bit line structure and located in the first nitride layer.

At step S102: the supporting structure is patterned to form a first via corresponding to the bit line structure in the bit line supporting layer.

At step S103: the bit line supporting layer is etched to a preset height along the first via, an etching parameter and a selective etching ratio of etching gas for an oxide layer to a nitride layer are adjusted, and the bit line supporting layer is continued to be etched until the bit line structure is exposed, to form a polymer layer above the bit line structure. The polymer layer is formed on part of a sidewall of the first via and located on both sides of the bit line structure.

FIGS. 2 to 13 are sectional views of a semiconductor device in each step of a method for preparing a semiconductor device according to embodiments of the disclosure. FIGS. 2, 4, 6, 8, 10 and 12 are sectional views along a first direction of each step of a method for preparing a semiconductor device 100 according to embodiments of the disclosure. In addition, FIGS. 3, 5, 7, 9, 11 and 13 are sectional views along a second direction of each step of a method for preparing a semiconductor device 100 according to embodiments of the disclosure.

Figure 2:
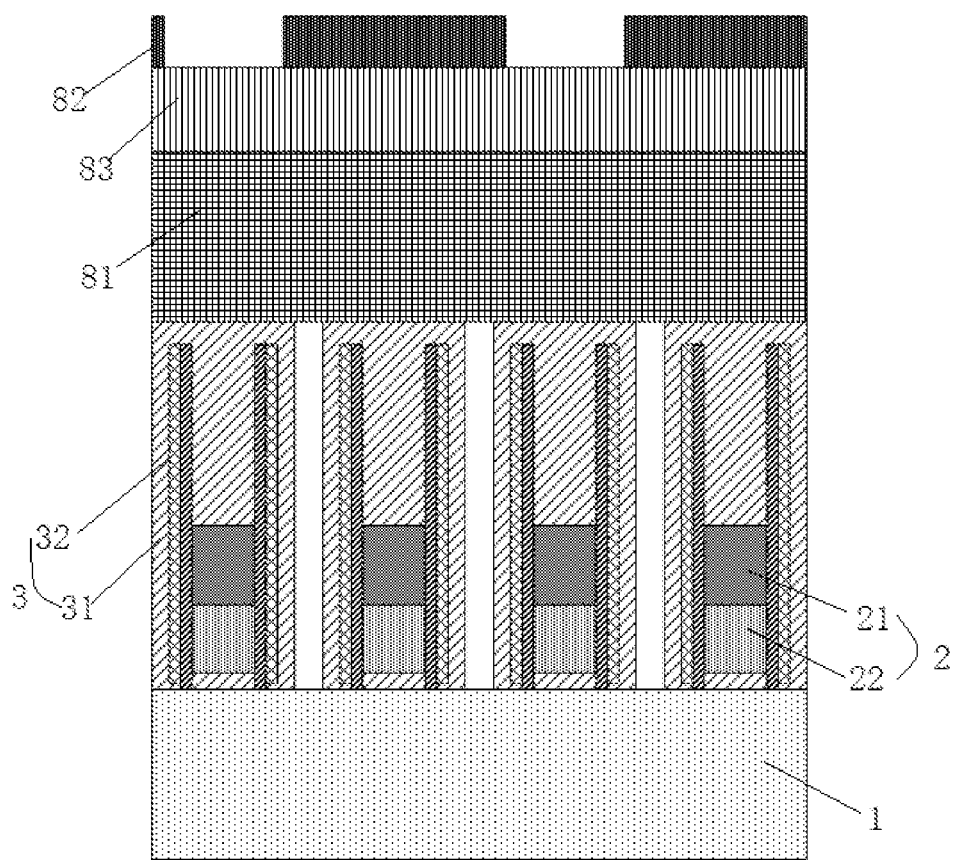
FIG. 2, FIG. 4, FIG. 6, FIG. 8.
Figure 3:
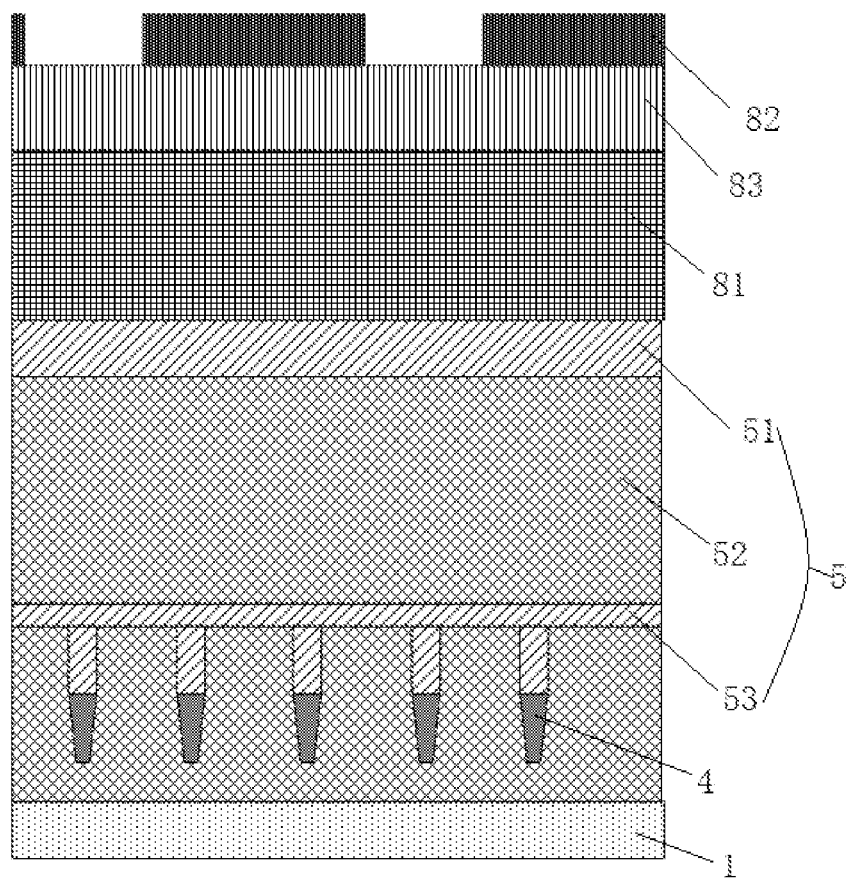
FIG. 3, FIG. 5, FIG. 7, FIG. 9, FIG. 11, and FIG. 13 are sectional views along a second direction of each step of a method for preparing a semiconductor device according to embodiments of the disclosure.
Figure 10:
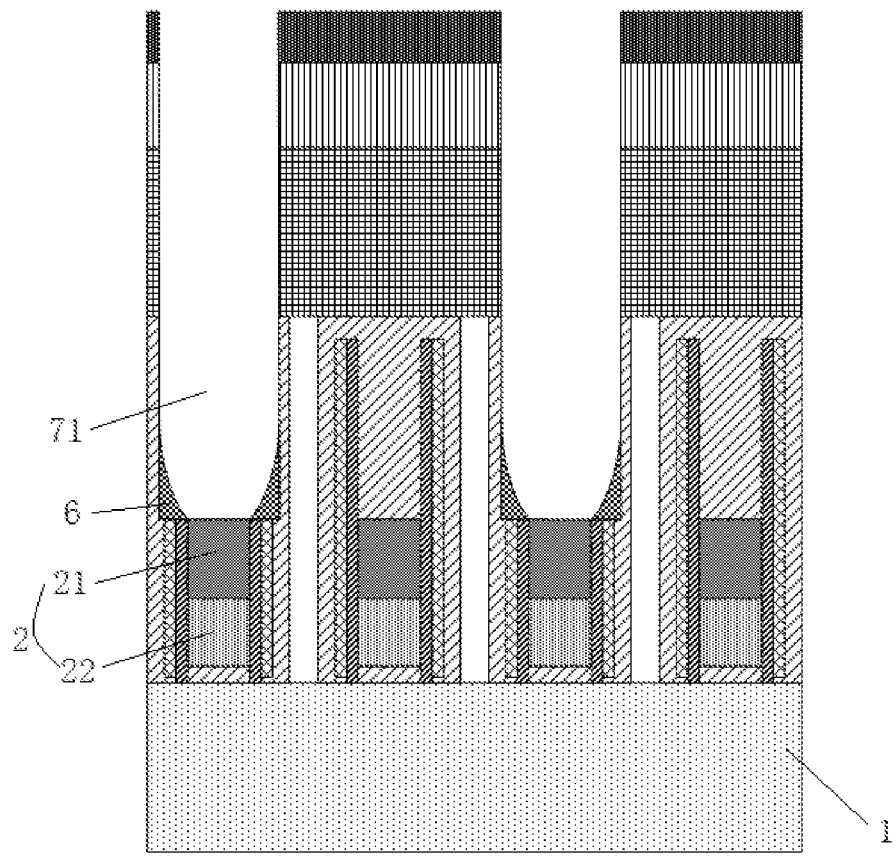
FIG. 10, and FIG. 12 are sectional views along a first direction of each step of a method for preparing a semiconductor device according to embodiments of the disclosure.

As shown in FIGS. 2, 3 and 10, a substrate 1 may be provided. A word line structure 4 may be formed in the substrate 1, and a supporting structure may be formed on the substrate 1. The supporting structure may include a bit line supporting layer 3 and a word line supporting layer 5 above the word line structure 4. A bit line structure 2 may be formed in the bit line supporting layer 3. The bit line supporting layer 3 may include a first oxide layer 32 and a first nitride layer 31. The bit line structure 2 may be formed in the first nitride layer 31, and the first oxide layer 32 may be formed on both sides of the bit line structure 2 and located in the first nitride layer 31.

The supporting structure may be patterned to form a first via 71 corresponding to the bit line structure 2 in the bit line supporting layer 3.

The bit line supporting layer 3 may be etched to a preset height along the first via 71. An etching parameter and a selective etching ratio of etching gas for an oxide layer to a nitride layer may be adjusted, and the bit line supporting layer 3 may be continued to be etched until the bit line structure 2 is exposed, to form a polymer layer 6 above the bit line structure 2. The polymer layer 6 may be formed on part of a sidewall of the first via 71 and located on both sides of the bit line structure 2.

As shown in FIGS. 2 and 3, a substrate 1 may be provided. A plurality of active regions may be formed in the substrate 1, and a plurality of word line trenches penetrating through the active regions may be formed. The trenches may be filled with dielectric media and wires to form the word line structure 4. The bit line structure 2 may be formed on the substrate 1 and traverse the word line structure 4.

A supporting structure may be formed on the substrate 1. The supporting structure may be a stacked structure formed by staking oxide layers and nitride layers. The nitride layers may be silicon nitride layers, and the oxide layer may be silicon oxide layers. The supporting structure may include the bit line supporting layer 3 and the word line supporting layer 5. The bit line structure 2 may be formed on the bit line supporting layer 3. The word line structure 4 may be formed in the substrate 1. The word line supporting layer 5 may be formed above the word line structure 4.

As shown in FIG. 2, the bit line supporting layer 3 may include the first nitride layer 31 and the first oxide layer 32.

The first nitride layer 31 and the first oxide layer 32 may be formed on the substrate 1. The bit line structure 2 may be formed in the first nitride layer 31. The first nitride layer 31 may wrap the bit line structure 2. The first oxide layer 32 may be formed in the first nitride layer 31 and formed on a side surface of the bit line structure 2. An upper surface of the first oxide layer 32 may be higher than an upper surface of the bit line structure 2, and lower than an upper surface of the first nitride layer 31. The bit line structure 2 may include a bit line conductive layer 21 and a bit line polycrystalline silicon layer 22. The bit line conductive layer 21 may be located above the bit line polycrystalline silicon layer 22. A sidewall of the bit line conductive layer 21 and a sidewall of the bit line polycrystalline silicon layer 22 may be flush with each other.

As shown in FIG. 3, the word line structure 4 may include a second nitride layer 51, a second oxide layer 52, and a third nitride layer 53 that are stacked. The third nitride layer 53 may be formed above the word line structure 4.

In combination with FIGS. 2 and 3, a mask layer and a photoresist layer 82 may be formed on the supporting structure. The mask layer may include a first mask layer 81 and a second mask layer 83. The first mask layer 81, the second mask layer 83, and the photoresist layer 82 may be sequentially formed on a surface of the supporting structure. The first mask layer 81 may be a carbon layer. The second mask layer 83 may be a hard mask layer, such as a nitride layer. The photoresist layer 82 may be an optical resist layer, which may be formed on a surface of the second mask layer 83 by a spin-coating process.

Figure 4:
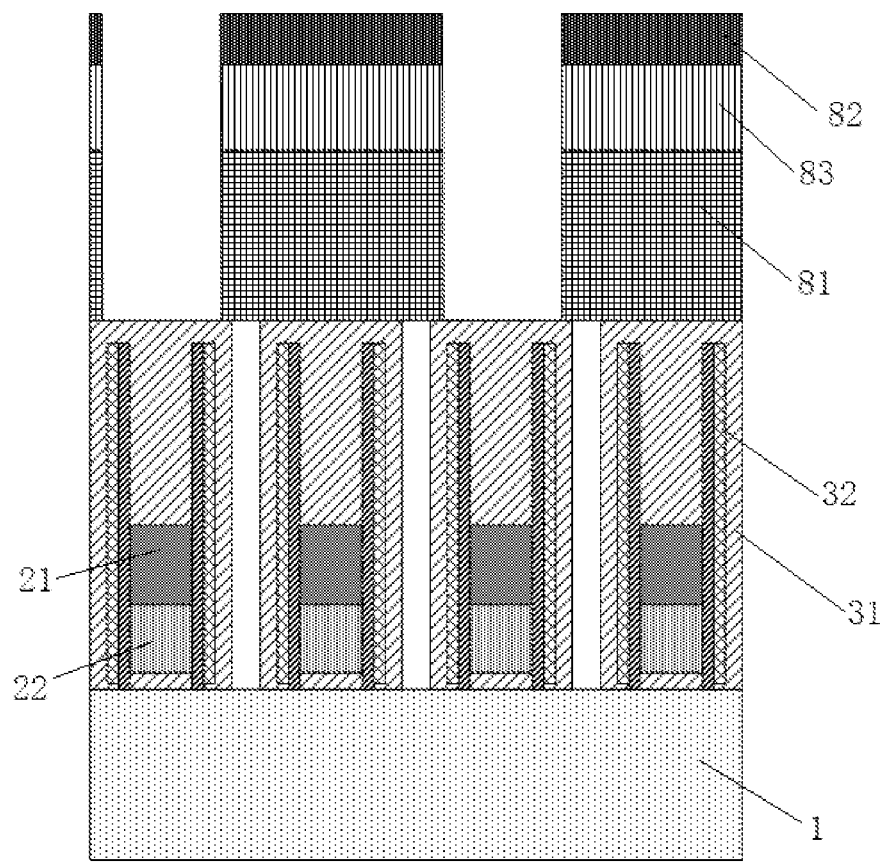
Figure 5:
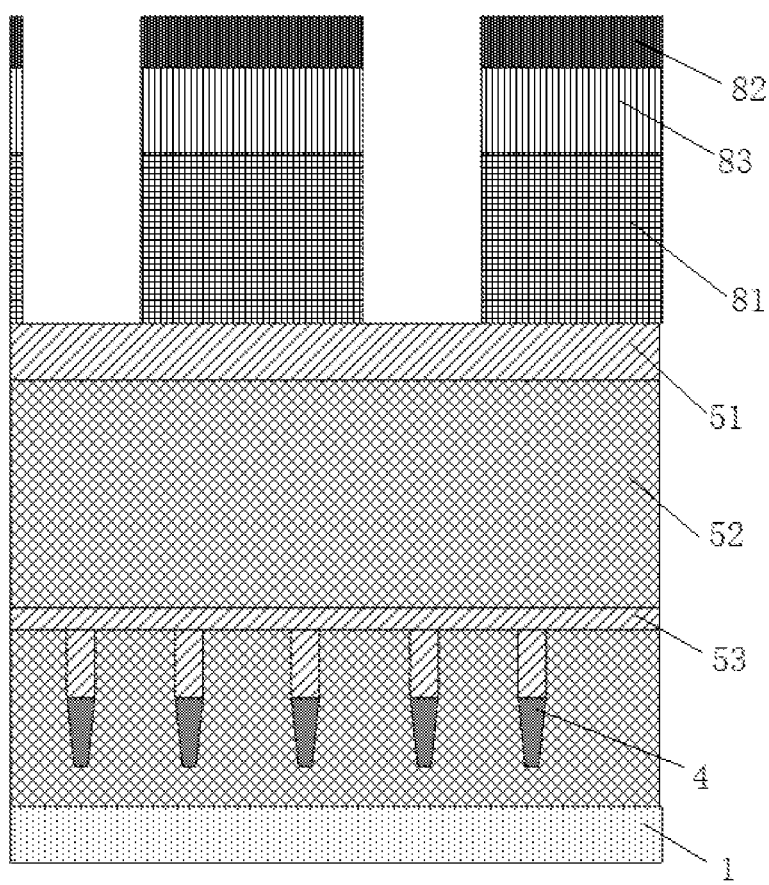

As shown in FIGS. 4 and 5, the photoresist layer 82 may be patterned, to correspondingly remove part of the photoresist layer 82 in regions of the first via 71 and the second via 72. Positions of the first via 71 and the second via 72 may be defined by the photoresist layer 82. A pattern of the photoresist layer 82 may be transferred to the mask layer, and a hole that penetrates through the mask layer may be formed, to form a patterned mask layer. As such, the mask layer may be taken as a mask, and the supporting structure may be patterned to form the first via 71 in the bit line supporting layer 3 and form the second via 72 in the word line supporting layer 5.

In combination with FIGS. 6 to 13, the patterned supporting structure may be used to fill and form a contact circuit, such as a bit line contact point 73 and a word line contact point 74. The step of patterning the supporting structure may be implemented step by step, so that the bit line structure 2 and the word line structure 4 can be etched at the same time during the etching process; and an external contour of the formed bit line contact point 73 can be controlled and improved, so as to facilitate formation and electrical connection of the bit line contact point 73.

The step of patterning the supporting structure to till and form a contact circuit may include the following steps.

Figure 6:
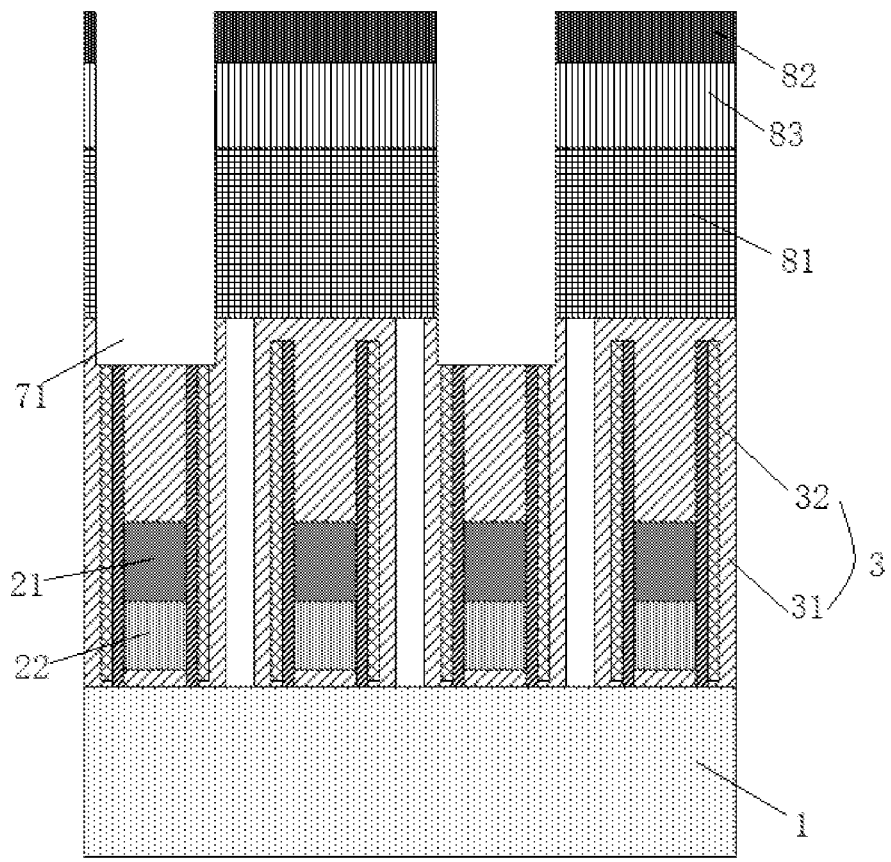
Figure 7:
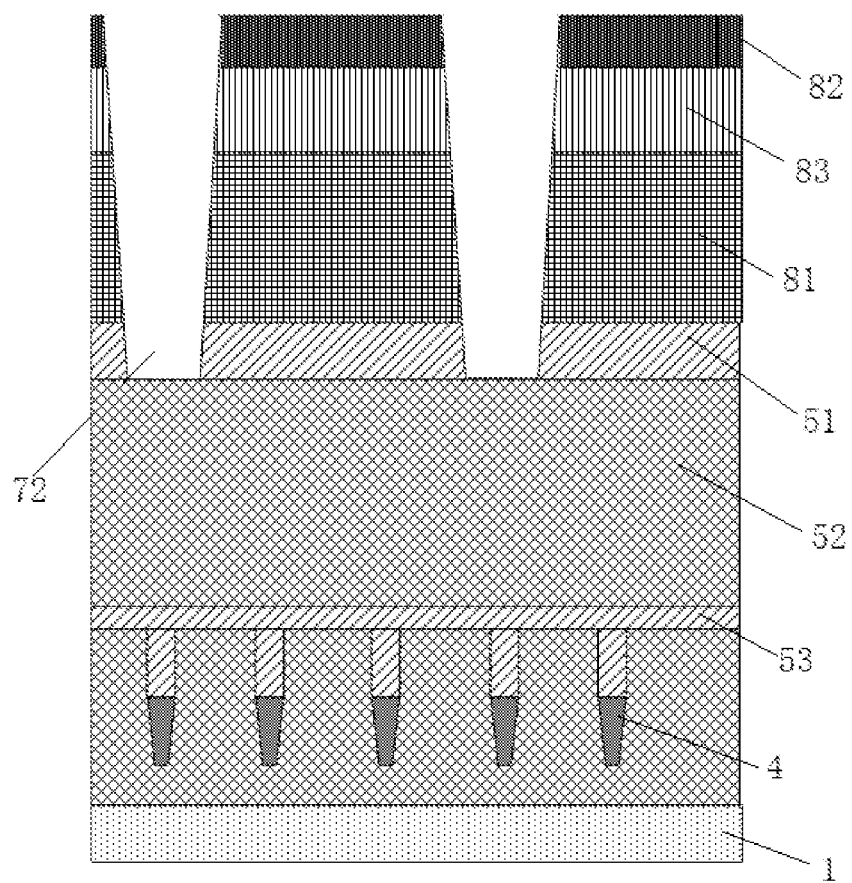

As shown in FIGS. 6 and 7, the supporting structure may be patterned to form the first via 71 corresponding to the bit line structure 2 in the bit line supporting layer 3, and to form the second via 72 corresponding to a position of the word line structure 4 in the word line supporting layer 5 at the same time, so as to expose the second oxide layer 52. In this step, the bit line supporting layer 3 and the word line supporting layer 5 may be etched by using first etching gas. A selective etching ratio of the first etching gas for the oxide layer to the nitride layer may be 0.1 to 0.5. That is, under a same etching condition, the first etching gas may be with different etching rates for oxides and nitrides. The selective etching ratio for the oxide layer to the nitride layer may be greater than or equal to 0.1 and less than or equal to 0.5. In this step, the etching efficiency of the first etching gas for the nitrides may be higher than the etching efficiency of the first etching gas for the oxides.

In some embodiments of the disclosure, the second nitride layer 51 and part of the first nitride layer 31 may be formed on an upper part of the supporting structure. In this step, the nitride layer of the supporting structure may be mainly etched. Therefore, the use of the first etching gas with a higher etching rate for the nitrides can accelerate the etching rate of the nitride layer on the upper part of the bit line supporting layer 3 and the upper part of the word line supporting layer 5, thereby improving the etching efficiency and shortening the etching time. The second oxide layer 52 may be below the second nitride layer 51. Since a material to be etched changes, the etching gas may be adjusted to change the selective etching ratio for the oxides to the nitrides.

In some embodiments, at the time of etching the bit line supporting layer 3 to the preset height along the first via 71, the second oxide layer 52 may be etched along the second via 72. In this step, the second oxide layer 52 and the bit line supporting layer 3 may be etched by using second etching gas.

In some other possible implementations, the step of etching the bit line supporting layer 3 to the preset height along the first via 71 may include etching the bit line supporting layer 3 to the preset height along the first via 71 by using the second etching gas. At the same time, the second oxide layer 52 may be etched along the second via 72 by using the second etching gas.

Figure 8:
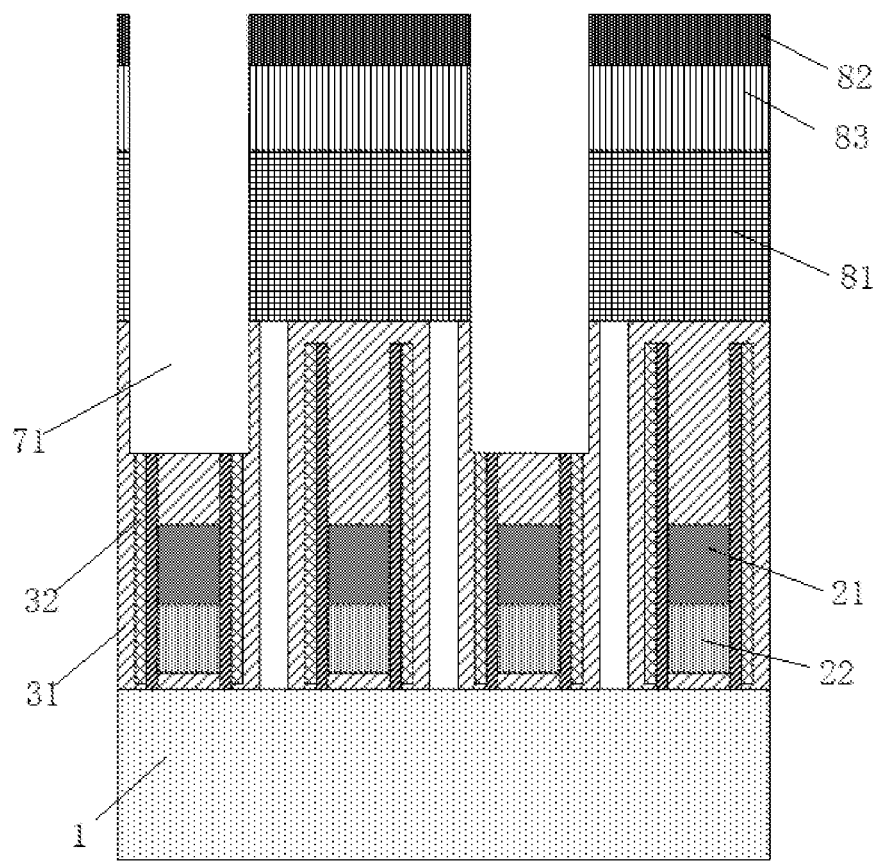
Figure 9:
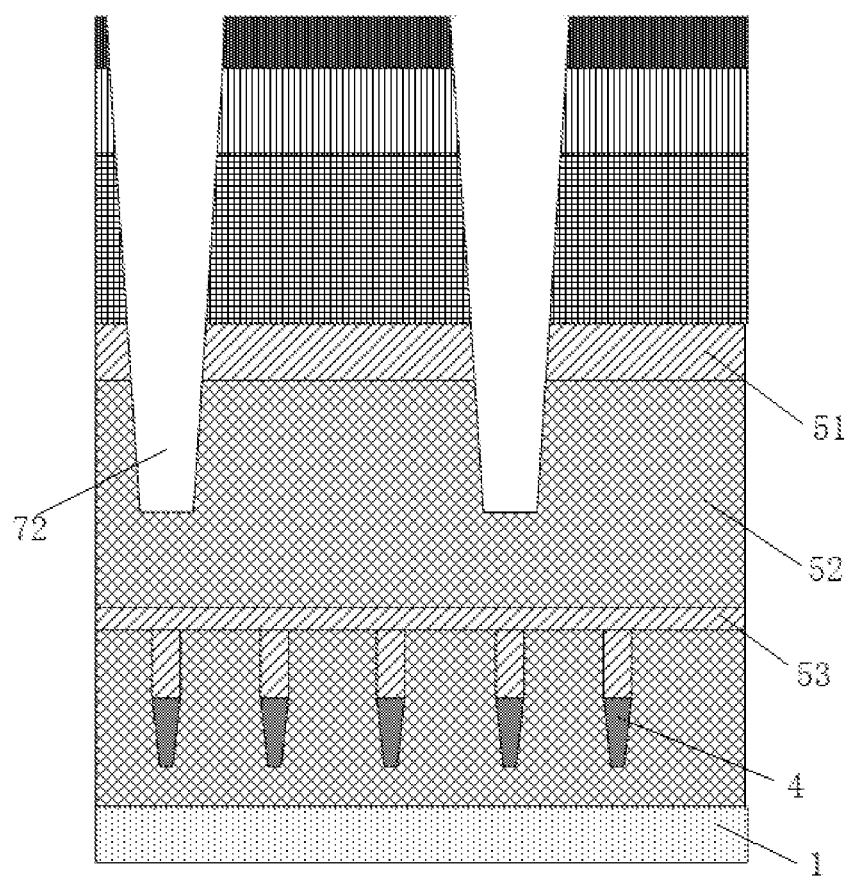

As shown in FIGS. 8 and 9, an upper surface of the bit line structure 2 may be higher than an upper surface of the word line structure 4. In order to etch to the surface of the bit line structure 2 and the surface of the word line structure 4 at the same time, the selective etching ratio for the oxide layer to the nitride layer may be changed by adjusting the etching gas, so that the second oxide layer 52 above the word line structure 4 can be etched faster, and the etching of the word line supporting layer 5 can be accelerated.

In the embodiments of the disclosure, after the supporting structure being etched to expose the second oxide layer 52, the etching gas may be adjusted. The bit line supporting layer 3 and the word line supporting layer 5 may be etched by using the second etching gas until the bit line supporting layer 3 is etched to the preset height along the first via 71. The selective etching ratio of the second etching gas for the nitride layer to the oxide layer may be 0.5 to 0.8. In this step, the etching efficiency of the second etching gas for the oxides may be higher than the etching efficiency of the second etching gas for the nitrides. In combination with FIGS. 8 and 9, after the bit line supporting layer 3 being etched to the preset height by using the second etching gas, the second oxide layer 52 may be etched to a certain depth along the second via 72 by the second etching gas. At this time, a lower surface of the second via 72 may be lower than a lower surface of the first via 71, which can accelerate the etching rate of the word line supporting layer 5.

In some embodiments, the step of adjusting the etching parameter and the selective etching ratio of the etching gas for the oxide layer to the nitride layer, and continuing to etch the bit line supporting layer 3 until the bit line structure 2 is exposed may include: adjusting the etching parameter and continuing to etch the bit line supporting layer 3 along the first via 71 and etch the word line supporting layer 5 along the second via 72 by using third etching gas, until the bit line structure 2 and the word line structure 4 are exposed.

In some other implementations, the step of adjusting the etching parameter and the selective etching ratio of the etching gas for the oxide layer to the nitride layer, and continuing to etch the bit line supporting layer 3 until the bit line structure 2 is exposed may include the following steps. The etching parameter and the selective etching ratio of the etching gas for the oxide layer to the nitride layer may be adjusted. The bit line supporting layer 3 may be continued to be etched along the first via 71 by using the third etching gas until the bit line structure 2 is exposed. The word line supporting layer 5 may be continued to be etched along the second via 72 by using the third etching gas until the word line structure 4 is exposed.

Figure 11:
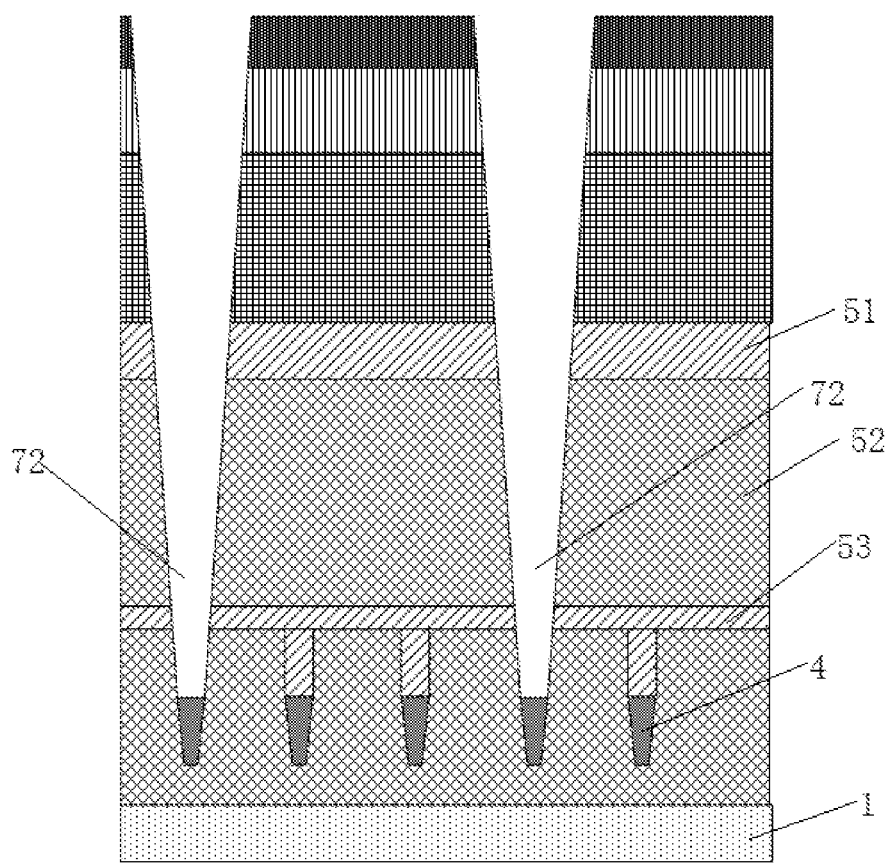

As shown in FIGS. 10 and 11, the etching parameter and the selective etching ratio of the etching gas for the oxide layer to the nitride layer may be adjusted, and a process of downward etching may be continued to be performed along the first via 71 and the second via 72 until the word line structure 4 and the bit line structure 2 are exposed. In this step, the bit line supporting layer 3 and the word line supporting layer 5 may be etched respectively by using the third etching gas. The selective etching ratio of the third etching gas for the nitride layer to the oxide layer may be 1.2 to 1.5. That is, after the adjustment, the etching rate of the third etching gas for the nitrides may be higher than the etching rate of the third etching gas for the oxides. Therefore, in the bit line supporting layer 3, the etching rate for the first nitride layer 31 may be higher than the etching rate for the first oxide layer 32, so that it may be easy to form a polymer layer 6 with a certain shape on the sidewall of the first via 71, and the contour of the sidewall of the first via 71 in the bit line supporting layer 3 can be controlled. As such, the contour of the subsequently formed bit line contact point 73 can be controlled and improved, and the electrical connection performance of the bit line contact point 73 can be improved. At the same time, by-products may be hard to be formed when the second oxide layer 52 is etched in the word line supporting layer 5, so that the sidewall contour of the second via 72 may be relatively flat and difficult to curve, which is favorable for subsequent formation of the word line contact point 74. The etching parameter may be adjusted in this step. The etching parameter may be an etching bias voltage, and the etching bias voltage may be at a power of 700 Watts to 1100 Watts, so that the polymer layer 6 with a curved inner wall surface can be easily formed on the nitride layer on the side wall of the second via 72. At the same time, the by-products may be hard to be formed when the oxide layer of the word line supporting layer 5 is etched, so that a curved inner wall may be hard to be formed, and the external contour of the word line contact point 74 that is subsequently filled can be controlled.

Figure 12:
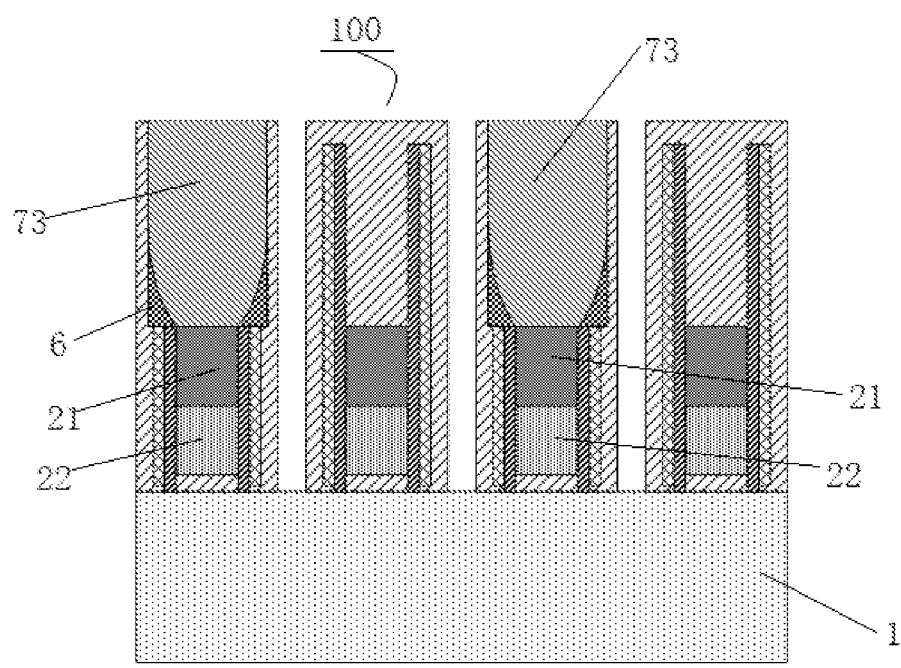
Figure 13:
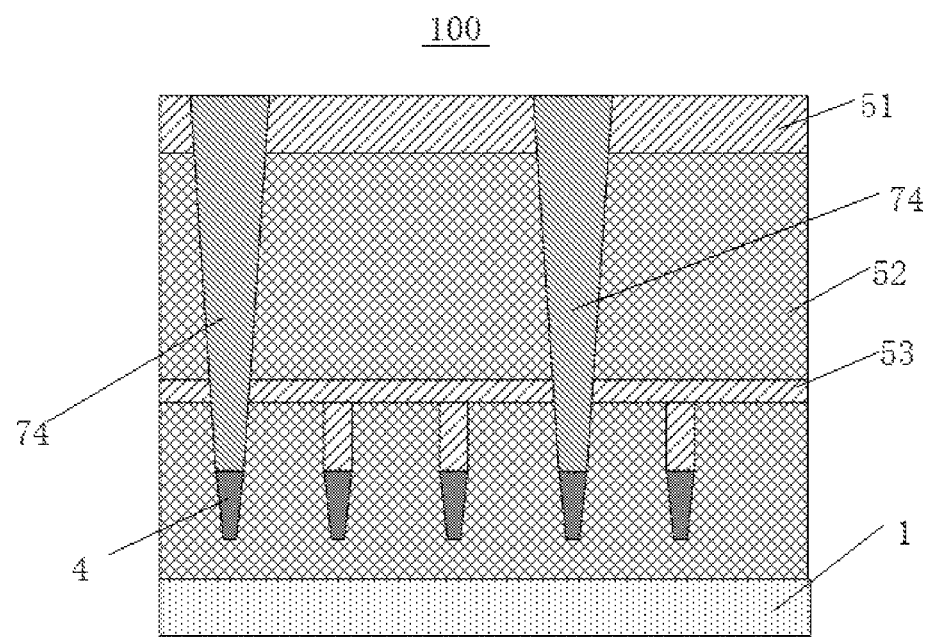

As shown in FIGS. 12 and 13, the first via 71 may be filled to form a bit line contact point 73, and the second via 72 may be filled to form a word line contact point 74. The bit line contact point 73 may be electrically connected to the bit line structure 2, and the word line contact point 74 may be electrically connected to the word line structure 4. Before the bit line contact point 73 and the word line contact point 74 being formed, the mask layer and the photoresist layer 82 may be removed, and the mask layer above the supporting structure may be pickled to control the external contours of the formed bit line contact point 73 and the formed word line contact point 74, and also to improve the electrical connection performance of the bit line contact point 73 and the word line contact point 74.

Embodiments of the disclosure further provide a semiconductor device 100. The semiconductor device 100 is formed by the method for preparing the semiconductor device 100 of the aforementioned embodiments.

As shown in FIG. 13, the semiconductor device 100 according to embodiments of the disclosure includes a substrate 1, a word line structure 4, a bit line structure 2, a supporting structure, and a polymer layer 6.

The word line structure 4 is formed in the substrate 1. The bit line structure 2 is formed on the substrate 1 and traverses the word line structure 4. The supporting structure is formed on the substrate 1 and includes a bit line supporting layer 3 and a word line supporting layer 5. The bit line supporting layer 3 includes a first oxide layer 32 and a first nitride layer 31. The bit line structure 2 is formed in the first nitride layer 31. The first oxide layer 32 is formed on both sides of the bit line structure 2 and in the first nitride layer 31. The word line supporting layer 5 includes a second nitride layer 51, a second oxide layer 52 and a third nitride layer 53 that are stacked. The second oxide layer 52 is formed between the second nitride layer 51 and the third nitride layer 53. A first via 71 is formed in the bit line supporting layer 3 to expose the bit line structure 2. A second via 72 is formed in the word line supporting layer 5 to expose the word line structure 4. The polymer layer 6 is formed in the first via 71 and formed on part of a sidewall of the first via 71 above the first oxide layer.

In some embodiments of the disclosure, an inner wall surface of the polymer layer 6 may be formed as an inclined surface from the sidewall of the first via 71 to a sidewall of the bit line structure 2. Furthermore, the inclined surface may be formed as a stepped surface or an arc-shaped surface.

As shown in FIG. 13, the semiconductor device 100 may further include a bit line contact point 73 and a word line contact point 74. The first via 71 may be filled to form the bit line contact point 73, and the second via 72 may be filled to form the word line contact point 74.

According to some embodiments of the disclosure, the word line supporting layer may include a second nitride layer, a second oxide layer, and a third nitride layer that are stacked. And at the time of patterning the supporting structure to form the first via corresponding to the bit line structure in the bit line supporting layer, a second via corresponding to the word line structure may be formed in the word line supporting layer to expose the second oxide layer.

In some embodiments of the disclosure, the step of patterning the supporting structure to form the first via corresponding to the bit line structure in the bit line supporting layer, may include etching the supporting structure by using first etching gas, Here, a selective etching ratio of the first etching gas for the oxide layer to the nitride layer may be 0.1 to 0.5.

In some embodiments of the disclosure, at the time of etching the bit line supporting layer to the preset height along the first via, the second oxide layer may be etched along the second via. Here, the second oxide layer and the bit line supporting layer may be etched by using second etching gas.

In some embodiments of the disclosure, the step of adjusting the etching parameter and the selective etching ratio of the etching gas for the oxide layer to the nitride layer, and continuing to etch the bit line supporting layer until the bit line structure is exposed may include: adjusting the etching parameter and continuing to etch the bit line supporting layer along the first via and etch the word line supporting layer along the second via by using third etching gas, until the bit line structure and the word line structure are exposed.

In some embodiments of the disclosure, a selective etching ratio of the second etching gas for the nitride layer to the oxide layer may be 0.5 to 0.8.

In some embodiments of the disclosure, a selective etching ratio of the third etching gas for the nitride layer to the oxide layer may be 1.2 to 1.5.

In some embodiments of the disclosure, the etching parameter may be an etching bias voltage, and the etching bias voltage may be at a power of 700 Watts to 1100 Watts.

In some embodiments of the disclosure, the step of patterning the supporting structure to form the first via corresponding to the bit line structure in the bit line supporting layer may further include: forming a mask layer and a photoresist layer on the supporting structure; patterning the photoresist layer, to remove part of the photoresist layer in regions of the first via and the second via; transferring a pattern of the photoresist layer to the mask layer, to form a patterned mask layer, and removing part of the supporting structure by taking the mask layer as a mask, to form the first via and the second via.

In some embodiments of the disclosure, the method may further include: filling the first via to form a bit line contact point, and filling the second via to form a word line contact point.

In some embodiments of the disclosure, after filling the first via to form the bit line contact point, and filling the second via to form the word line contact point, the method may further include: removing the photoresist layer and the mask layer.

In some embodiments of the disclosure, an inner wall surface of the polymer layer may be formed as an inclined surface from the sidewall of the first via to a sidewall of the bit line structure.

In some embodiments of the disclosure, the inclined surface may be formed as a stepped surface or an arc-shaped surface.

In some embodiments of the disclosure, the semiconductor device may further include a bit line contact point and a word line contact point. The first via may be filled to form the bit line contact point, and the second via may be filled to form the word line contact point.

The above descriptions are only the preferred implementations of the disclosure. It should be noted that those of ordinary skill in the art can further make several improvements and modifications without departing from the principles of the disclosure. These improvements and modifications should also all fall within the protection scope of the disclosure.

The invention claimed is:

1. A method for preparing a semiconductor device, comprising:
providing a substrate, wherein a word line structure is formed in the substrate and a supporting structure is formed on the substrate, the supporting structure comprising a bit line supporting layer and a word line supporting layer above the word line structure, wherein a bit line structure is formed in the bit line supporting layer, the bit line supporting layer comprises a first oxide layer and a first nitride layer, the bit line structure is formed in the first nitride layer, and the first oxide layer is formed on both sides of the bit line structure and located in the first nitride layer;

patterning the supporting structure to form a first via corresponding to the bit line structure in the bit line supporting layer; and etching the bit line supporting layer to a preset height along the first via, adjusting an etching parameter and a selective etching ratio of etching gas for an oxide layer to a nitride layer, and continuing to etch the bit line supporting layer until the bit line structure is exposed, to form a polymer layer above the bit line structure, wherein the polymer layer is formed on part of a sidewall of the first via and located on both sides of the bit line structure.

2. The method for preparing the semiconductor device of claim 1, wherein the word line supporting layer comprises a second nitride layer, a second oxide layer, and a third nitride layer that are stacked;

and wherein at the time of patterning the supporting structure to form the first via corresponding to the bit line structure in the bit line supporting layer, a second via corresponding to the word line structure is formed in the word line supporting layer to expose the second oxide layer.

3. The method for preparing the semiconductor device of claim 2, wherein the step of patterning the supporting structure to form the first via corresponding to the bit line structure in the bit line supporting layer comprises etching the supporting structure by using first etching gas, wherein a selective etching ratio of the first etching gas for the oxide layer to the nitride layer being 0.1 to 0.5.

4. The method for preparing the semiconductor device of claim 2, wherein at the time of etching the bit line supporting layer to the preset height along the first via, the second oxide layer is etched along the second via; wherein the second oxide layer and the bit line supporting layer are etched by using second etching gas.

5. The method for preparing the semiconductor device of claim 2, wherein the step of adjusting the etching parameter and the selective etching ratio of the etching gas for the oxide layer to the nitride layer, and continuing to etch the bit line supporting layer until the bit line structure is exposed comprises: adjusting the etching parameter and continuing to etch the bit line supporting layer along the first via and etch the word line supporting layer along the second via by using third etching gas, until the bit line structure and the word line structure are exposed.

6. The method for preparing the semiconductor device of claim 4, wherein a selective etching ratio of the second etching gas for the nitride layer to the oxide layer is 0.5 to 0.8.

7. The method for preparing the semiconductor device of claim 5, wherein a selective etching ratio of the third etching gas for the nitride layer to the oxide layer is 1.2 to 1.5.

8. The method for preparing the semiconductor device of claim 5, wherein the etching parameter is an etching bias voltage, and the etching bias voltage is at a power of 700 Watts to 1100 Watts.

9. The method for preparing the semiconductor device of claim 2, wherein the step of patterning the supporting structure to form the first via corresponding to the bit line structure in the bit line supporting layer further comprises:

forming a mask layer and a photoresist layer on the supporting structure;

patterning the photoresist layer, to remove part of the photoresist layer in regions of the first via and the second via;

transferring a pattern of the photoresist layer to the mask layer, to form a patterned mask layer; and removing part of the supporting structure by taking the mask layer as a mask, to form the first via and the second via.

10. The method for preparing the semiconductor device of claim 9, further comprising: filling the first via to form a bit line contact point, and filling the second via to form a word line contact point.

11. The method for preparing the semiconductor device of claim 10, wherein after filling the first via to form the bit line contact point, and filling the second via to form the word line contact point, the method further comprises removing the photoresist layer and the mask layer.

12. A semiconductor device, comprising:
a substrate;
a word line structure formed in the substrate;
a bit line structure formed on the substrate and traversing the word line structure;
a supporting structure formed on the substrate; wherein the supporting structure comprises a bit line supporting layer and a word line supporting layer, the bit line supporting layer comprising a first oxide layer and a first nitride layer; wherein the bit line structure is formed in the first nitride layer, and the first oxide layer is formed on both sides of the bit line structure and in the first nitride layer; wherein the word line supporting layer comprises a second nitride layer, a second oxide layer and a third nitride layer that are stacked, and the second oxide layer is formed between the second nitride layer and the third nitride layer, wherein a first via is formed in the bit line supporting layer to expose the bit line structure, and a second via is formed in the word line supporting layer to expose the word line structure; and
a polymer layer formed in the first via and formed on part of a sidewall of the first via above the first oxide layer.

13. The semiconductor device of claim 12, wherein an inner wall surface of the polymer layer is formed as an inclined surface from the sidewall of the first via to a sidewall of the bit line structure.

14. The semiconductor device of claim 13, wherein the inclined surface is formed as a stepped surface or an arc-shaped surface.

15. The semiconductor device of claim 12, further comprising a bit line contact point and a word line contact point, wherein the first via is filled to form the bit line contact point, and the second via is filled to form the word line contact point.

* * * * *